US010679964B2

(12) United States Patent
Dayeh et al.

(10) Patent No.: US 10,679,964 B2
(45) Date of Patent: Jun. 9, 2020

(54) SOLID-STATE WAFER BONDING OF FUNCTIONAL MATERIALS ON SUBSTRATES AND SELF-ALIGNED CONTACTS

(71) Applicant: The Regents of the University of California, Oakland, CA (US)

(72) Inventors: Shadi A. Dayeh, San Diego, CA (US); Renjie Chen, Albuquerque, NM (US)

(73) Assignee: The Regents of the University of California, Oaklana, CA (US)

( * ) Notice: Subject to any disclaimer, the term of this patent is extended or adjusted under 35 U.S.C. 154(b) by 43 days.

(21) Appl. No.: 15/521,886

(22) PCT Filed: Nov. 3, 2015

(86) PCT No.: PCT/US2015/058802
§ 371 (c)(1),
(2) Date: Apr. 25, 2017

(87) PCT Pub. No.: WO2016/073460
PCT Pub. Date: May 12, 2016

(65) Prior Publication Data
US 2017/0317050 A1    Nov. 2, 2017

Related U.S. Application Data

(60) Provisional application No. 62/074,864, filed on Nov. 4, 2014.

(51) Int. Cl.
*H01L 21/285* (2006.01)
*H01L 21/18* (2006.01)
(Continued)

(52) U.S. Cl.
CPC ............... *H01L 24/83* (2013.01); *G02B 6/13* (2013.01); *H01L 21/185* (2013.01);
(Continued)

(58) Field of Classification Search
CPC ..... H01L 24/83; H01L 24/29; H01L 27/0605; H01L 2224/29171; H01L 2224/29184;
(Continued)

(56) References Cited

U.S. PATENT DOCUMENTS 5,262,347 A * 11/1993 Sands ................... B23K 20/002
148/DIG. 12
5,346,848 A    9/1994 Grupen-Shemansky et al.
(Continued)

FOREIGN PATENT DOCUMENTS

WO    2006068409 A1    6/2006

OTHER PUBLICATIONS

Renjie Chen and Shadi A. Dayeh, "Sizie and Orientation Effects on the Kinetics and Structure of Nickelide Contacts to InGaAs Fin Structures", Nano Letters, vol. 15, No. 6, pp. 3770-3779, Apr. 16, 2015.
(Continued)

*Primary Examiner* — Nelson Garces
(74) *Attorney, Agent, or Firm* — Greer, Burns & Crain, Ltd.; Steven P. Fallon

(57) ABSTRACT

A method for integrating III-V semiconductor materials onto a rigid host substrate deposits a thin layer of reactive metal film on the rigid host substrate. The layer can also include a separation layer of unreactive metal or dielectric, and can be patterned. The unreactive metal pattern can create self-aligned device contacts after bonding is completed. The III-V semiconductor material is brought into contact with the thin layer of reactive metal. Bonding is by a low temperature heat treatment under a compressive pressure. The reactive metal and the functional semiconductor material are selected to undergo solid state reaction and form a stable alloy under the low temperature heat treatment without degrading the III-V material. A semiconductor device of
(Continued)

the invention includes a functional III-V layer bonded to a rigid substrate via an alloy of a component of the functional III-V layer and a metal that bonds to the rigid substrate.

26 Claims, 7 Drawing Sheets

(51) Int. Cl.

| | | |
|---|---|---|
| *H01L 27/06* | (2006.01) | |
| *H01L 23/00* | (2006.01) | |
| *G02B 6/13* | (2006.01) | |
| *H01L 21/8252* | (2006.01) | |
| *H01S 5/02* | (2006.01) | |
| *H01L 21/8258* | (2006.01) | |

(52) U.S. Cl.
CPC ...... *H01L 21/187* (2013.01); *H01L 21/28575* (2013.01); *H01L 21/8252* (2013.01); *H01L 24/29* (2013.01); *H01L 27/0605* (2013.01); *H01S 5/0215* (2013.01); *H01L 21/8258* (2013.01); *H01L 2224/29082* (2013.01); *H01L 2224/29155* (2013.01); *H01L 2224/29164* (2013.01); *H01L 2224/29166* (2013.01); *H01L 2224/29171* (2013.01); *H01L 2224/29184* (2013.01); *H01L 2224/29187* (2013.01); *H01L 2224/8383* (2013.01); *H01L 2224/83203* (2013.01); *H01L 2924/05042* (2013.01); *H01L 2924/05432* (2013.01); *H01L 2924/05442* (2013.01); *H01L 2924/20107* (2013.01)

(58) Field of Classification Search
CPC . H01L 2224/83203; H01L 2224/29155; H01L 2924/05432; H01L 2224/29164; H01L 2224/29082; H01L 2924/05442; H01L 2224/8383; H01L 2224/29166; H01L 2924/05042; H01L 2224/29187; H01L 21/02389; H01L 21/02392; H01L 29/20; H01L 21/02395; H01L 21/02398; H01L 21/02538–02549; H01L 29/2003–207; H01L 29/2006–207; H01L 21/18; H01L 21/242; H01L 21/2233; H01L 21/2215; H01L 21/8252; H01L 21/24–248; H01L 21/40; H01L 21/02255; H01L 21/324–3247; H01L 21/477; H01L 21/76828; H01L 21/76864; H01L 21/187; H01L 21/185; H01L 21/28575; H01L 2924/20107; H01L 21/8258; H01S 5/0215; G02B 6/13; C23C 14/0617; C23C 16/301–303
USPC ............................................ 257/615; 437/86
See application file for complete search history.

(56) References Cited

U.S. PATENT DOCUMENTS

| | | | |
|---|---|---|---|
| 5,391,257 | A | 2/1995 | Sullivan et al. |
| 6,030,884 | A | 2/2000 | Mori |
| 7,608,471 | B2 | 10/2009 | Bahl |
| 2009/0065142 | A1* | 3/2009 | Zhang .................. C25D 5/022 156/308.2 |
| 2010/0035052 | A1 | 2/2010 | Farah |
| 2013/0302901 | A1* | 11/2013 | Lindsay .......... G01N 33/48721 436/94 |

OTHER PUBLICATIONS

Czornomaz, L., et al., "An integration path for gate-first UTB III-V-on-insulator MOSFETs with silicon, using direct wafer bonding and donor wafer recycling", Electron Devices Meeting (IEDM), 2012 IEEE International, Dec. 10-13, 2012.

Dai, X., et al., "Novel Heterogeneous Integration Technology of III-V Layers and InGaAs FinFETs to Silicon", Advanced Functional Materials, vol. 24, Issue 28, Jul. 23, 2014, pp. 4420-4426.

Dayeh, Shadi, A., et al., "Integration of vertical InAs nanowire arrays on insulator-on-silicon for electrical isolation", Applied Physics Letters, vol. 93, No. 20, (Dec. 2008), pp. 203109-203109-3.

Shane Thomas, International Search Report for Application No. PCT/US2015/058802, dated Feb. 2, 2016.

* cited by examiner

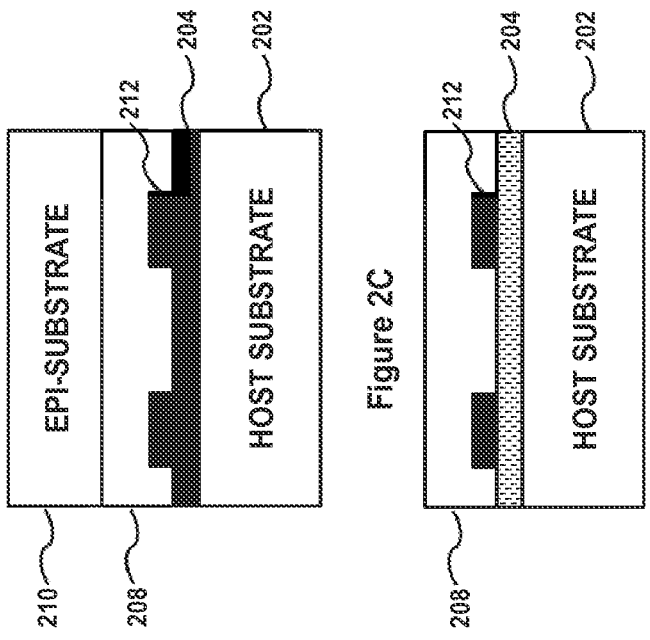
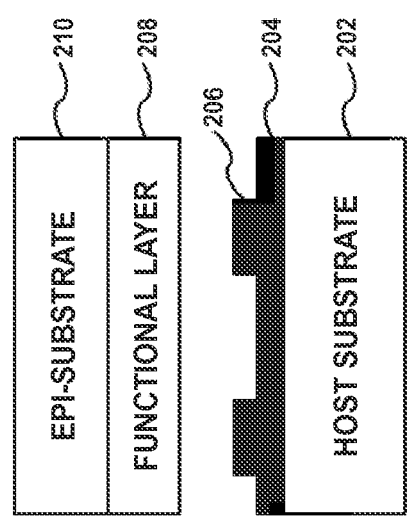

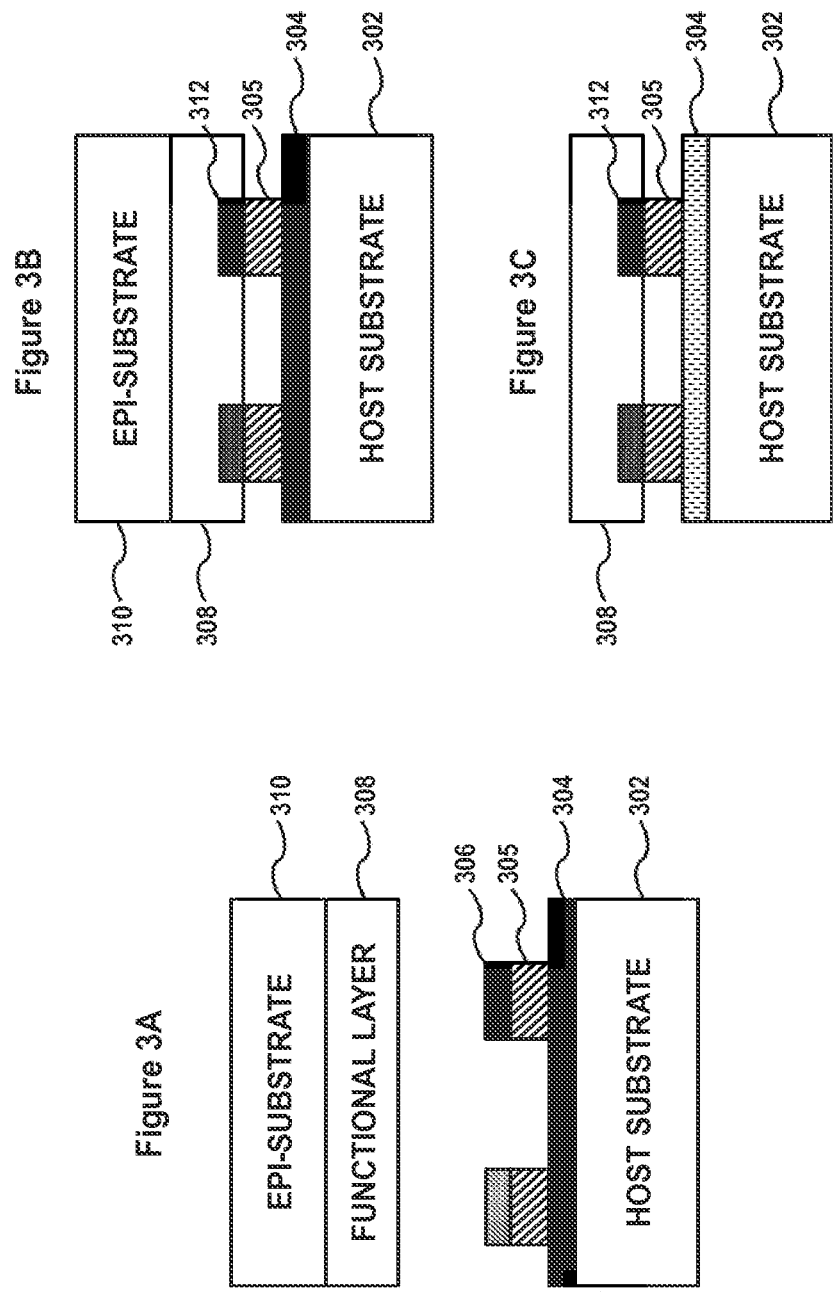

SOLID-STATE WAFER BONDING OF FUNCTIONAL MATERIALS ON SUBSTRATES AND SELF-ALIGNED CONTACTS

PRIORITY CLAIM AND REFERENCE TO RELATED APPLICATION

The application claims priority under 35 U.S.C. § 119 and all applicable statutes and treaties from prior provisional application Ser. No. 62/074,864, which was filed Nov. 4, 2014.

FIELD

A field of the invention is semiconductors, semiconductor devices, and semiconductor fabrication processes.

BACKGROUND

III-V compound semiconductor materials include elements from the third group (such as Al, Ga, and In) and fifth group (such as N, P, As, and Sb) of the periodic table. The III-V compound semiconductor materials are commonly used in high-speed transistors and in optoelectronic devices. III-V fabrications are more expensive than silicon fabrications. The semiconductor industry has therefore sought to combine the high-speed III-V semiconductors as both electronic and optoelectronic devices with low-cost Si circuitry.

Integration of III-V functional devices on Si substrates has been achieved by epitaxial growth of III-V material layers on Si. See, Yonezu, Hiroo, "Control of structural defects in group III-V-N alloys grown on Si," Semiconductor science and technology 17.8: 762 (2002). Integration has also been achieved by directly bonding of III-V semiconductor layers with a Si wafer. Grupen-Shemansky, et al., U.S. Pat. No. 5,346,848 (Method of bonding silicon and III-V semiconductor materials) discloses a method that uses a semiconductor interlayer formed on the III-V material prior to bonding to a silicon wafer. The interlayer is silicon dioxide, doped silicon dioxide, silicon nitride, polysilicon, or amorphous silicon. The III-V layer is thinned after bonding to relieve stress. In this method, the interlayers (dielectric layers deposited on both III-V surface and Si side) are brought together to form bond through van der Waals' forces, which often require high annealing temperatures for activation. This method provides temperatures as low as 200° C. This process is a form of direct wafer bonding process that requires extreme cleanness and flatness of the bonding interface (and in some cases elevated bonding temperature beyond 200° C.). These bonding approaches tend to have low yields, especially for large area bonding beyond 1×1 cm$^2$. Additionally, during cooling, the mismatch in the thermal expansion coefficients can lead to defects in the III-V device layer. The strength of bonds achieved at lower temperatures of 200° C. may also be lower than when higher temperatures are used. Generally, artisans use higher temperatures in the direct bonding processes to ensure bond strength. Bothra U.S. Pat. No. 6,030,884 (Hexagonal semiconductor die, semiconductor substrates, and methods of forming a semiconductor die) discloses use of a strained semiconductor layer between the silicon layer and the III-V group compound semiconductor layer prior to high temperature (>450° C.) heat treatment for bonding. Strained semiconductor layers attempt to compensate for direct bonding problems, and the high temperature is poorly suited for CMOS processes in general, and is at the onset of decomposition of most III-V compound semiconductors. Czornomaz, L., et al. "An integration path for gate-first UTB III-V-on-insulator MOSFETs with silicon, using direct wafer bonding and donor wafer recycling." Electron Devices Meeting (IEDM), 2012 IEEE International. IEEE (2012), discloses transfer of high-quality InGaAs/InAlAs heterostructures ($t_{ch}$<10 nm) by direct wafer bonding and hydrogen-induced thermal splitting. This is also a high temperature process that makes use of a dielectric interlayer to achieve direct wafer bonding. The donor wafer that provided the III-V heterostructures can be recycled to reduce cost.

With such conventional epitaxial growth processes, the heteroepitaxial growth of III-V semiconductors on a Si surface is hampered by the high density of crystal defects in the grown III-V layer, which is caused by the large difference in the lattice constant between the III-V materials and Si (lattice mismatch, generally >5%). This approach is not compatible with CMOS fabrication processes due to the high temperature required to epitaxially grow the III-V material on Si.

Such conventional bonding processes for of III-V semiconductors onto Si wafers generally require a heat treatment at elevated temperature to induce atomic re-arrangements at the intimately touched interface for secure bonding. The sample surfaces need to be treated to achieve a total surface roughness less than 1 nm to activate bonding. This high temperature heat treatment and subsequent cooling stage may introduce a large thermal stress and subsequent crystal defects in the III-V semiconductor layer.

Other bonding methods have been proposed to meet different requirements of device fabrication. This include epitaxial transfer (Ko, Hyunhyub, et al. "Ultrathin compound semiconductor on insulator layers for high-performance nanoscale transistors." Nature 468.7321 286-289 (2010)), eutectic bonding (Wolffenbuttel, R. F., and K. D. Wise. "Low-temperature silicon wafer-to-wafer bonding using gold at eutectic temperature." Sensors and Actuators A: Physical 43.1 223-229 (1994), and adhesive bonding (Niklaus, Frank, et al. "Adhesive wafer bonding." Journal of applied physics 99.3 031101 (2006)). These methods are not typically compatible with CMOS process due to complicated procedures, or due to strong changes to the surface morphology of bonding layer. The Wolffenbuttel method, for example, involves heating to temperature higher than Au—Si eutectic point (melting temperature of Au—Si alloy), which is not preferable for an industrial CMOS process. Alloys with Au are also not CMOS compatible. Melting introduces a liquid phase, which introduces the possibility of damage to device geometries or structures.

For example, the eutectic bonding process of Wolffenbuttel and Wise involves dissolution of Si to form a liquid phase. This dissolution and the required Au are not desired in a CMOS compatible process, and can fail to provide for electrical isolation between the metal and semiconductor. The Ko et al. process patterns InAs films with PMMA nanoribbons, wet etches an underling AlGaSB layer and transfers the InAs nanoribbons to silicon/silicon dioxide substrates with an elastomeric PDMS slab. The etching, polymer materials and transfers and not easily adapted to CMOS processing, and the shape of structures that can be formed is limited to the nanoribbon shape. The Frank adhesive process identifies polymers that are suitable for adhesive wafer bonding. Adhesive bonding may prevent long-term stability of device operations, causing problems with polymer ageing, device heat dissipation, etc. Bahl, U.S. Pat. No. 7,608,471 discloses a process to transfer III-V structures separated from each other by score lines extending through a separation layer to a sapphire substrate. The structures are aligned with bonding pads on a silicon substrate and are fused to the pads. A laser is used to decompose separation layers and removing portions of the III-V wafer that are not fused, which concludes a complex process that is not generally compatible with CMOS fabrication and limits shapes of the fabrications. Generally, these methods don't allow the integration of arbitrary-shaped device layers to desired locations on a CMOS circuit freely.

SUMMARY OF THE INVENTION

An embodiment of the invention is a method for integrating III-V semiconductor materials onto a rigid host substrate. A thin layer of reactive metal film is deposited on the rigid host substrate. The layer can also include a separation layer of unreactive metal or dielectric, and can be patterned. The unreactive metal pattern can create self-aligned device contacts after bonding is completed. The layer can also be recessed into the rigid host substrate. A preferred host substrate is silicon, such as a silicon wafer. Other rigid substrates include glass and sapphire. The III-V semiconductor material is brought into contact with the thin layer of reactive metal. Bonding is by a low temperature heat treatment under a compressive pressure. A preferred temperature range is 220° C. to 300° C. Higher temperatures that avoid degradation of the III-V material can also be used. The thin layer of reactive metal and the functional semiconductor material are selected to undergo solid-state reaction and form a stable alloy under the low temperature heat treatment without degrading the III-V material. Preferred reactive metals are Ni and Pd, and preferred III-V materials include arsenide and phosphide III-V materials.

A semiconductor device of the invention includes a functional III-V layer bonded to a rigid substrate via an alloy of a component of the functional III-V layer and a metal that bonds to the rigid substrate. The bond between the functional III-V layer and the rigid substrate can consists of the alloy. The rigid substrate is preferably silicon, and preferably a silicon wafer.

BRIEF DESCRIPTION OF THE DRAWINGS

FIGS. 2A-2C are schematic diagrams illustrating another preferred method for integrating a thin layer of functional III-V semiconductor with a rigid host substrate;

FIGS. 3A-3C are schematic diagrams illustrating another preferred method for integrating a suspended thin layer of functional III-V semiconductor with a rigid host substrate;

DESCRIPTION OF THE PREFERRED EMBODIMENTS

Figure 1A:
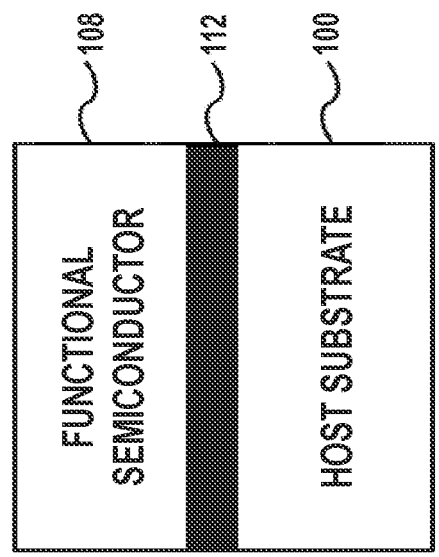
FIGS. 1A and 1B are schematic diagrams illustrating a preferred method for integrating a bulk III-V semiconductor with a rigid host substrate.

An embodiment of the invention is a wafer bonding method for integrating bulk or thin film functional III-V semiconductor materials to a rigid host substrate (e.g., a Si substrate such as an Si wafer, glass, sapphire, etc.). Preferred methods exploit a solid-state reaction between a functional semiconductor layer and a metal layer that is pre-deposited or pre-patterned on the rigid host substrate, a low temperature heat treatment (e.g., preferably 220-450° C., more preferably 220-300° C., and most preferably 220-250° C. and a fast bonding process, e.g. requiring only a few minutes. In preferred embodiments, bonding is achieved in less than 20 minutes. With a metal layer having lower area density than 15% the higher end of the 220-300° C. range is preferred, and only III-V materials that decompose above 450° C. (GaAs, GaP, AlAs, etc.) should use temperatures above 300° C.

A "functional" layer is a III-V layer that can perform a semi-conducting function required by a device. A functional layer can perform a function required, for example, in a transistor, optical waveguides, semiconductor laser or other device.

Preferred methods of the invention tolerate levels of surface roughness for both the functional semiconductors and the host substrate that are not tolerated by prior methods discussed in the background. Preferred methods also provide for self-aligned contact formation. Preferred methods further enable bonding of multiple layers of functional semiconductors to the host substrate with precise location control. Preferred integrated III-V/rigid substrates of the invention provide a platform to fabricate advanced electronic and optoelectronic devices utilizing the transferred functional semiconductors on Si, in a CMOS compatible fabrication process.

Preferred embodiment methods integrate III-V semiconductors onto Si with steps that are compatible with current CMOS fabrication procedures. Preferred methods of the invention cause minimum or zero crystal defects to the bonded semiconductor layers, and enable further fabrication of advanced functional devices using the bonded layers atop functional CMOS circuitry without degraded performance.

Preferred methods are based on the solid-state reaction between a metal layer and III-V material, which can tolerate the roughness and defects at the bonding interface. Yields in bonding can be very high as a result, and the method can be expected to provide 100% yields or close to 100% yields. The bonding based on the solid-state reaction between metal and III-V material involves a chemical reaction that is stable and irreversible.

Preferred embodiments are based on the reaction between metal (Ni for example) and Si to form metal silicide. This reaction doesn't require a melting eutectic and it happens in solid phase at temperatures as low as 220° C., with a preferred temperature of 280° C. This is a one directional diffusion reaction in which Ni diffuses into Si but not the other way around.

Preferred embodiments provide Self-aligned Electrical Contacts (SAEC). Pre-patterned electrical metal contacts on a host substrate play the dual roles of bonding with functional semiconductors and also as conductive electrical leads to the outer electrodes. Preferred embodiments integrate III-V (or other functional semiconductor) materials onto rigid host substrates (for example Si) by a solid-state reaction between the III-V semiconductor and a metal layer (for example Ni or Pd) pre-defined on the host substrate. Preferred embodiments advantageously provide 1) Tolerance to surface imperfections; 2) Compatibility to Si CMOS processes; 3) Integration to a variety of substrates; 4) the ability to provide multi-layer stacking; and 5) Self-aligned electrical contacts for III-V transistors on Si, which is a foundation for short-channel high-performance devices.

The invention enables the integration of high-mobility III-V transistor layers, such as InGaAs, atop Si CMOS circuits. It also enables the integration of the high-speed optoelectronic elements made from InP (waveguides, modulators, switches and photodetectors) that are necessary for optical transmission with large data rate and bandwidth atop a Si CMOS circuit. Such mixed platform circuits can be used to produce powerful systems that can greatly benefit systems that handle large amounts of data, such as big data centers and large servers. The invention can also provide for on-chip optical processing in microprocessor chips, which has widespread application to sensor and communication systems. Further, light emission (Lasers, light emitting diodes) and detection (photodetctors, photoconductors, photovoltaic cells) made of III-V materials can be integrated with on Si CMOS.

Present preferred methods of the invention integrate III-V (or other functional semiconductor) materials onto rigid host substrate (for example Si) by a solid-state reaction between the III-V semiconductor and a metal layer or patterned metal layer (for example Ni or Pd) pre-defined on the host substrate. Compared with existing bonding methods, the present invention provides a number of advantages that artisans will appreciate.

One advantage provided by the invention is tolerance to surface imperfections. There is no need for surfaces to have a total surface roughness of bonded surfaces of less than 1 nm to activate Van der Waals or H- or hydroxyl group bonding in non-eutectic bonding with methods of the invention. Instead, methods of the invention gradually eliminate surface roughness by the mechanism of metal diffusion into the III-V semiconductors (in a small protrusion) during the solid-state reaction that will eventually equilibrate to planarize interfaces and levels the bonded layers flat on the Si substrate. The reaction between Ni and InGaAs equilibrate during the process after nucleation of the new NiInGaAs phase. The "eventually equilibrate" here means that the Ni will be finally completely consumed, forming a stable bonding and planarized interface.

Another advantage provided by the invention is compatibility to with CMOS fabrication processes. An example embodiment demonstrated experimentally showed that the solid-state reaction between a typical III-V semiconductor, InGaAs, and a Ni metal layer, can be achieved at temperatures as low as 220° C. This preferred wafer bonding method is accomplished with heat treatment generally around 250-300° C., and the bonding quality didn't show degradation with post-bonding anneals at temperatures up to 500° C. Even though the eutectic bonding method discussed in the background has been used in Si wafer bonding processes, based on the eutectic reaction between Si and Au, it involves the dissolution of Si to form liquid phase and the Au is not desired in a CMOS compatible process. Further, the present bonding approach can provide for electrical isolation between metal-semiconductor alloyed patterns whereas eutectic bonding doesn't preserve a pre-patterned metal lead shape and intermixes with neighboring liquid solution at the bonding temperature.

Another advantage provided by the invention is integration to a variety of substrates. III-V semiconductors can be bonded atop any rigid host substrate provided that there is a thin metal layer pre-deposited on the host substrate and that this metal layer can form a solid-state reaction with the III-V semiconductor. This can include silicon wafers, for example, but also other rigid substrates such as glass and sapphire.

Multi-layer stacking is another advantage provide by the invention. With diffusion barrier layers, dissimilar materials such as different composition III-V layers, can be integrated in a layer-by-layer fashion on a substrate such as Si, in a planar technology approach that is compatible with Si CMOS processing.

The self-aligned electrical contacts for III-V transistors on Si provided by preferred embodiments also provide advantages. Electrical metal contacts are first defined on the host substrate and the metal contacts have the functions not only for bonding with functional semiconductors but also for conducting current to the outer world. The bonding approach results in low resistivity self-aligned contacts that can provide very short channel and high performance devices.

The invention has been demonstrated experimentally. The experiments showed feasibility of the present manufacturing methods for bonding III-V semiconductor materials to a rigid host substrate by utilizing metal-semiconductor solid-state reactions. Both bulk (InP) and thin film (InGaAs) III-V semiconductors have been successfully bonded to Si wafer with $SiO_2$ dielectric layer in the lab. The experimental results demonstrated the wafer bonding technology and the SAEC process for advanced functional device fabrication in a CMOS compatible process. This is the basis for active III-V devices on top of CMOS circuitry.

A semiconductor device of the invention includes a functional III-V layer bonded to a rigid substrate via an alloy of a component of the functional III-V layer and a metal that bonds to the rigid substrate. The bond between the functional III-V layer and the rigid substrate can consists of the alloy. The rigid substrate is preferably silicon, and preferably a silicon wafer.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

Figure 1B:
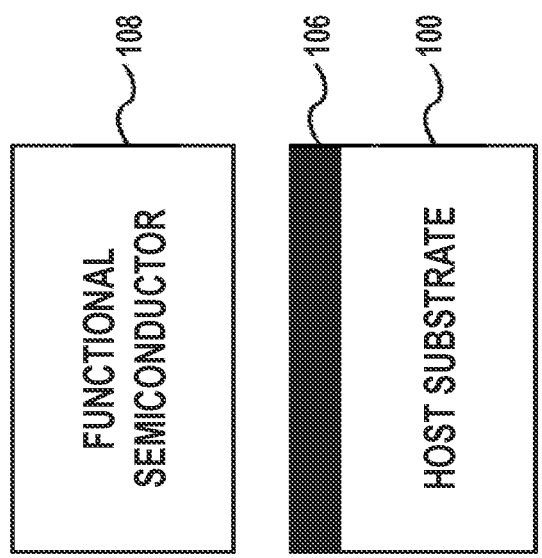

FIGS. 1A and 1B illustrate sequential steps of a first preferred embodiment for bonding a bulk III-V semiconductor material on a rigid host substrate, and illustrates a preferred device of the invention. In the first embodiment according to the present invention, a thin layer of metal 106 (e.g. Ni, Pd) is first deposited (Sputter, e-beam evaporation, thermal evaporation, etc.) on the rigid host substrate 100 (e.g. Silicon, glass, sapphire, etc.), and then a bulk functional semiconductor 108 is brought into contact with the metal 106. The metal layer thickness is usually 20-100 nm, and can be calculated based on the volume density of the final formed alloy phase composition. Generally, it is desired that the metal layer thickness to be less than half of the thickness of the III-V semiconductor layer to be bonded. The bonding is then performed by a low temperature heat treatment under a compressive pressure, in a vacuum chamber with forming gas ($H_2$ 5% in $N_2$) flow. An example temperature is preferably below 300° C. and more preferably below 250° C. and in the range above 220° C. The temperature must be high enough to induce a solid state reaction between the semiconductor and the metal 106 and induce alloy formation, but low enough to avoid degradation of the host substrate 100 or the III-V material. Bonding temperatures up to about 450° C. are possible depending upon the materials, and materials that don't decompose at this level are GaAs, GaP, AlAs, etc. An example compressive pressure is 10 MPa, and the pressures is preferably in the range of 5 MPa to 20 MPa. The pressure is sufficient for the metal/III-V surface to be in intimate contact for the reaction to happen but low enough to avoid cracking of either wafer. This method induces and takes advantage of the solid-state reaction between the semiconductor 108 and the metal layer 106. Other combinations of semiconductors and metals include those combinations that can form a stable alloy 112 under a relatively low temperature heat treatment (<300° C.). Ni is a preferred metal for use with a number of III-V compound semiconductors. Ni provides the advantage of being compatible with, and is commonly employed in CMOS integrated circuits. Ni can form a stable alloy through solid-state reaction with various Arsenide and Phosphide semiconductors, such as InAs, GaAs, InGaAs, AlAs, InP, etc. The Ni/III-V alloy was demonstrated experimentally to integrate III-V material and silicon, and shown to tolerate surface roughness at both the functional semiconductor 108 and the metal layer 106, with only simple surface cleaning and treatment to remove the native oxide layers prior to bonding. Preferred surface cleaning is via acetone airbrush to remove large debris and particles, followed by a treatment of hydrofluoric acid dip to remove the native oxide layer. Preferably, after the deposit of the metal layer, a mild flow of $N_2$ gas is used to remove particles, and the surface is ready for bonding after that without further treatment. Bonding is preferably conducted in a thermal furnace or a vacuum chamber, flowing with forming gas, $N_2$ gas, or Ar gas. The formed device includes a functional III-V layer bonded to a rigid substrate via the formed alloy of a component of the functional III-V layer and the deposited metal that bonds to the rigid substrate. The bond between the functional III-V layer and the rigid substrate can consists of the alloy. The rigid substrate is preferably silicon, and preferably a silicon wafer.

FIGS. 2A-2C illustrate sequential steps of a second preferred embodiment for bonding a thin layer of III-V semiconductor material on a rigid host substrate 202, via patterned metal 206 and a thin film functional layer 208 that is upon a III-V epitaxial substrate 210. In the second embodiment, the thin film functional semiconductor layer can be either grown on an epitaxial substrate 210 with different material or formed from the same material as the epitaxial substrate 210. Isolation between the III-V functional layer 208 and the epitaxial substrate 210 (used as a handle layer) can be provided after bonding. For example, the isolation between thin film layer 208 and bulk substrate 210 can be later achieved by either selective wet etching (see Dai, Xing, et al. "Novel Heterogeneous Integration Technology of III-V Layers and InGaAs FinFETs to Silicon." Advanced Functional Materials (2014)) or "ion-smart cut" method using H ion implantation (see Dayeh, Shadi A., et al. "Integration of vertical InAs nanowire arrays on insulator-on-silicon for electrical isolation." Applied Physics Letters 93.20 (2008): 203109). The host substrate 202 can be, for example, sapphire, glass, or silicon with a $SiO_2$ 204 insulation layer, which can prevent the leakage current through the substrate for the applications of electronic and optoelectronic devices. Because of the thin body of the semiconductor layer 208, the metal film 106 in the first embodiment is replaced by patterned metal structures 206, so that the solid-state reaction between semiconductor 208 and the metal structures 206 will not consume all the semiconductor layer by forming alloy 212 (FIG. 2B) but yet provides sufficient strength for the bonding and leaves unreacted regions in the semiconductor 208 to fabricate the active portions of the device. Preferably, the metal layer 206 has a thickness less than or equal to half the thickness of the thin III-V functional layer 208. FIG. 2C illustrates removal of the handle layer 210 (EPI substrate), which can be accomplished by etching. The functional layer 208 can also be thinned in additional step of thinning the III-V material to a desired thickness. Thinning can be accomplished, for example, with lapping, polishing, smart ion cutting, or selective dry or wet etching.

FIGS. 3A-3C illustrate sequential steps of a third preferred embodiment for bonding a suspended thin layer of III-V semiconductor material on a rigid host substrate 302, via a separation layer 305, patterned metal layer 306, and functional layer on a III-V epitaxial substrate 310. The bonding process is the same as in FIGS. 2A-2C, but the separation layer 305 provides for a gap between the functional layer 308 and the dielectric layer 304 of the host substrate 302. The separation layer 305 (either metal or dielectric) does not react with the semiconductor layer 308 at the bonding temperature. Preferred metals for the separation layer include Cr, Ti, or W. Preferred dielectrics include $Al_2O_3$, $SiO_2$, $Si_3N_4$. This separation layer 305 provides for two functions: 1) If the separation layer 305 is an inert metal or dielectric layer, the bonded semiconductor layer 308 is simply suspended with a air gap between the host substrate 302 and 304. The separation between functional semiconductor layer 308 and the host substrate 302 and 304 can benefit advanced electronic and optoelectronic device fabrications on top of the transferred semiconductor layer 308, such as gate-around transistors, and low-cost optical modulators and switches. 2) If the separation layer 305 is a conductive metal layer, it can be utilized as the electric contacts, typically the source/drain for CMOS transistors, to the outer electrodes. In this kind of device geometry, electric contacts are embedded underneath the semiconductor layer with a "self-aligned" manner, in which the contact leads and wafer bonding are achieved simultaneously through the same metal layer.

Figure 4B:
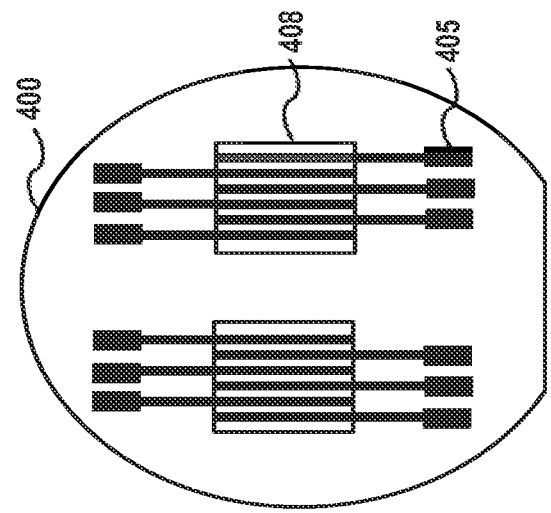
FIGS. 4A-4B are schematic diagrams illustrating the result a preferred method for forming self-aligned contacts.
Figure 4A:
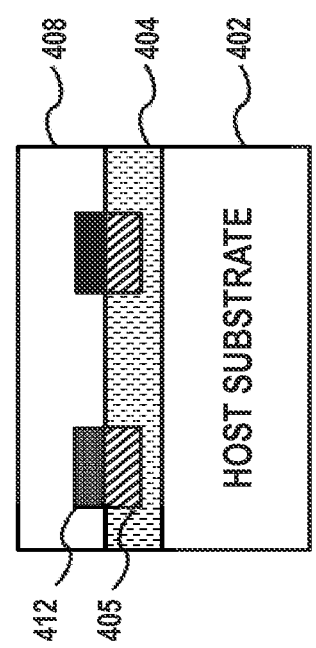

FIGS. 4A-4B illustrates the result of a fourth preferred embodiment for forming self-aligned electrical contacts on a host substrate 401, via a patterned metal 405 and a functional III-V layer. The bonding process is the same as in 2A-2C, and FIGS. 4A and 4B show the finished structures corresponding to FIG. 4C. Compared to FIGS. 2A-2C, the conductive metal layer 405 (e.g. Ti) includes portions that extend into the dielectric layer 404 on top of the host substrate 402 instead of being merely on top of the patterned layer 206. This can be achieved by patterning the positions of metal layers (with photolithography or e-beam lithography), and etching the patterned regions (with either wet etch or dry etch method) prior to the metal layer deposition. The bonding will then be performed with the solid-state reaction between the top of the metal layer 405 and the functional semiconductor layer 408 to form the alloy 412, but the bottom of the metal layer 405 will not react with the semiconductor layer 408 and only serves as the conductive electrical lead and as a diffusion barrier of either elements of Ni or the III-V material down to the Si substrate, resulting in one metal barrier layer (bottom metal) in between Ni (top metal) and Si substrate. When the bottom layer 405 does not need to form a conductive lead, it can alternatively be formed from a dielectric layer. From the top view schematic, multiple functional semiconductor layers 408 can be bonded to selective areas on the host wafer 400, with a die-to-wafer bonding manner (See, e.g., Roelkens, Günther, et al. "III-V/Si photonics by die-to-wafer bonding." Materials Today 10.7 (2007): 36-43). The metal layer 405 that does not react with semiconductor layer 408 will eventually conduct the current from beneath the semiconductor layer all the way to the outer electrodes through the electrical contact leads.

EXPERIMENTS

Fabrication was conducted experimentally with example materials to demonstrate the invention. Bulk (InP) and thin film (InGaAs) III-V semiconductors have been successfully bonded to a Si wafer with $SiO_2$ dielectric layer in the experiments.

Figure 5:
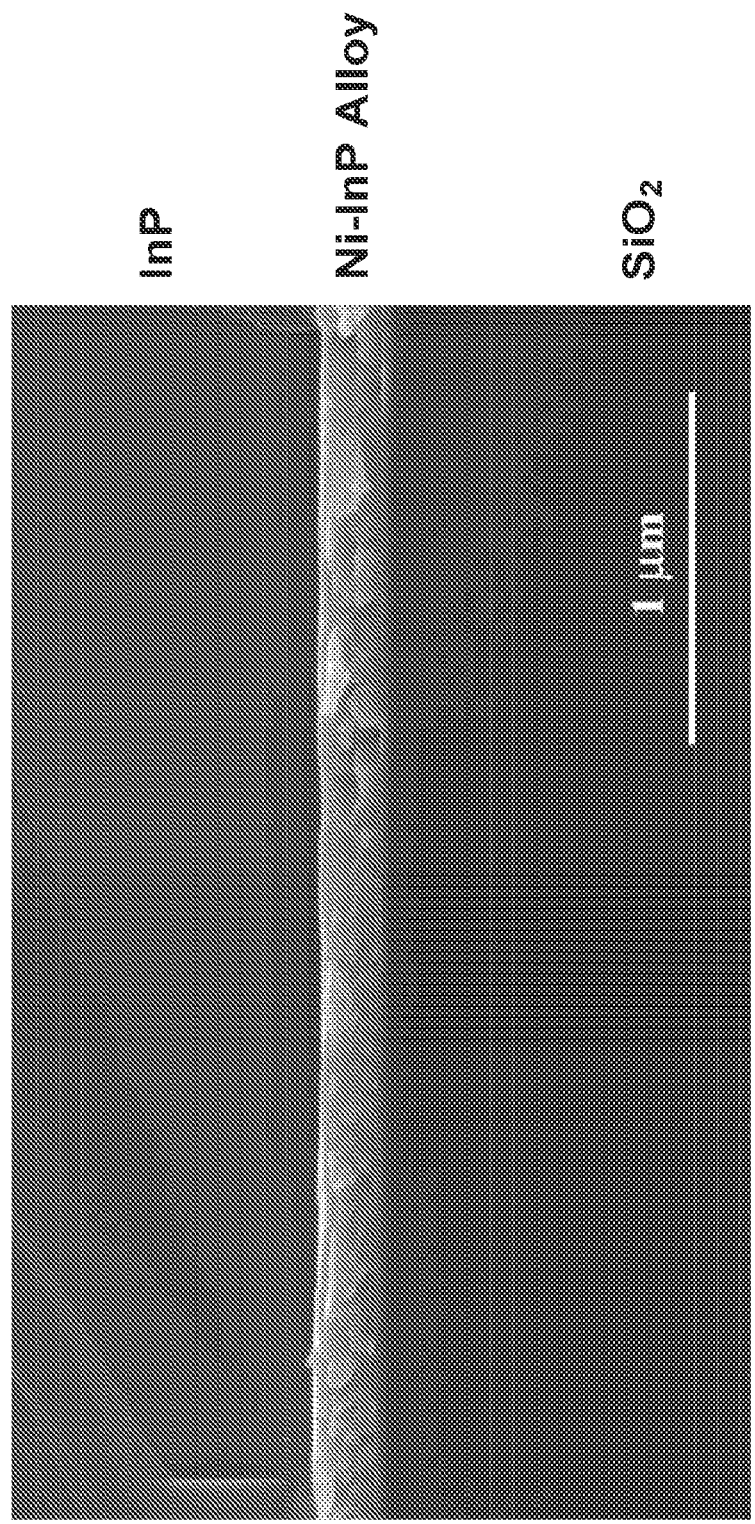
FIG. 5 is a cross-sectional SEM image of an example InP functional layer integrated with a silicon substrate that was formed in an experiment to demonstrate the invention.

In a first set of experiments according to FIGS. 1A-1B, bulk InP was bonded to a Si wafer with a $SiO_2$ dielectric layer. A diced InP substrate was first cleaned with acetone airbrush to remove large debris and particles, followed by a hydrofluoric acid dip to remove the native oxide layer. Thin Ti/Ni (25 nm/100 nm) metal layers are deposited on the clean $SiO_2$/Si wafer surface, in which the Ti layer acts as an adhesion layer for Ni and will not react with InP at the bonding temperature. The InP substrate with fresh surface was then brought together with the Ni layer, and the bonding was performed at 250° C. for 15 min in an RTA system under vacuum with forming gas flow. A silver metal binder clip was used to apply pressure (around 10 MPa) to the two adhered wafers. FIG. 5 shows the cross sectional view of the bonded sample, and the formed Ni—InP alloy has a thickness that is approximately twice the thickness of the initially deposited Ni layer, indicating the formation of alloy via the reaction of the Ni and the InP. Not apparent from the image of FIG. 5 layer is a thin layer of Ti that is between Si and the reacted Ni—InP alloy.

Figures 6A, 6B, 6C:
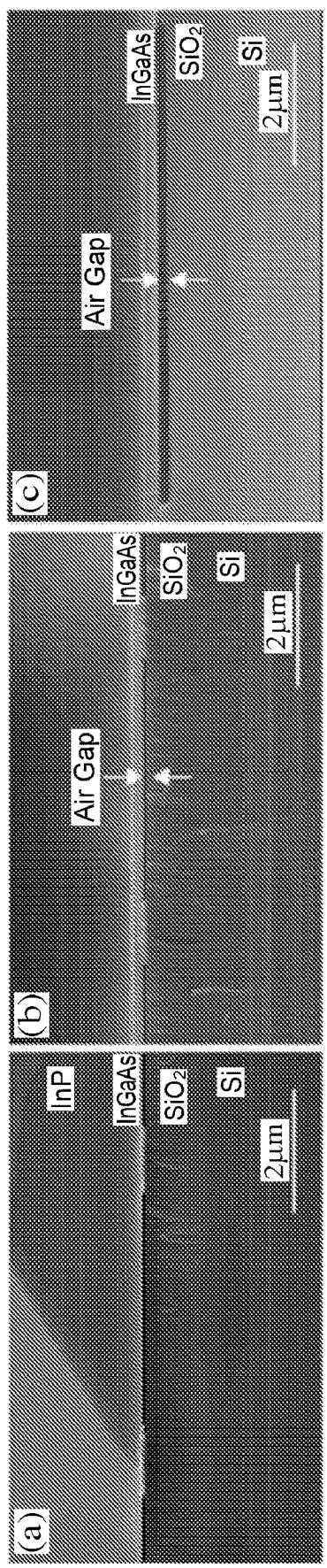
FIGS. 6A-6C are cross-sectional SEM images showing the sequential steps of bonding an InGaAs layer suspended on a $SiO_2$/Si substrate in an additional experiment to demonstrate the invention.

FIGS. 6A-6C are cross-sectional SEM images showing the sequential steps of bonding an InGaAs layer on a $SiO_2$/Si substrate with a gap separation in between formed in a second set of experiments consistent with FIGS. 3A-3C. FIG. 6A shows the InP wafer with $In_{0.53}Ga_{0.47}As$ epi-layer was bonded to a $SiO_2$/Si substrate through the solid-state reaction between patterned Ni structures and InGaAs. FIG. 6B shows the InP wafer was removed by lapping and then selective wet etching in HCl. The air gap is determined by the thickness of the Ti layer (50 nm) that served the purpose of the separation layer 305 of FIGS. 3A-3C, and the patterned metal lines are 2 μm in width with 5 μm separation. FIG. 6C shows another sample with a InGaAs layer bonded on a $SiO_2$/Si substrate that used a thicker Ti layer as a separation layer. The air gap is 200 nm (determined by the thickness of Ti layer), and the patterned metal lines are 4 um in width with 10 um separation. Thin film InGaAs (200 nm) was bonded to a Si wafer with $SiO_2$ dielectric layer. The 200 nm $In_{0.53}Ga_{0.47}As$ layer was epitaxially grown on the InP substrate, and photolithography-patterned opening lines were processed on top of the $SiO_2$/Si wafer surface followed by thin Ti/Ni (60 nm/40 nm) metal layers deposition. After surface cleaning and oxide layer removal as mentioned above, the InGaAs film surface was brought into contact with the patterned Ti/Ni lines, and then the same bonding condition as in the first experiments was applied. FIG. 6A shows the cross sectional view of the bonded sample, and the separation between the InGaAs film and $SiO_2$/Si wafer was primarily determined by the thickness of the Ti layer. FIG. 6B demonstrates the removal of bulk InP substrate by selective wet etching, and that the thin film InGaAs layer was successfully bonded to the host substrate. FIG. 6C further illustrates the flexibility of tuning the width/pitch of the Ti/Ni lines, and also the air gap between the InGaAs film and the host substrate with different Ti thicknesses. With decreasing of the density of bonding metal lines, the bonding temperature needs to be increased but to no more than 300° C.

Figures 7A, 7B:
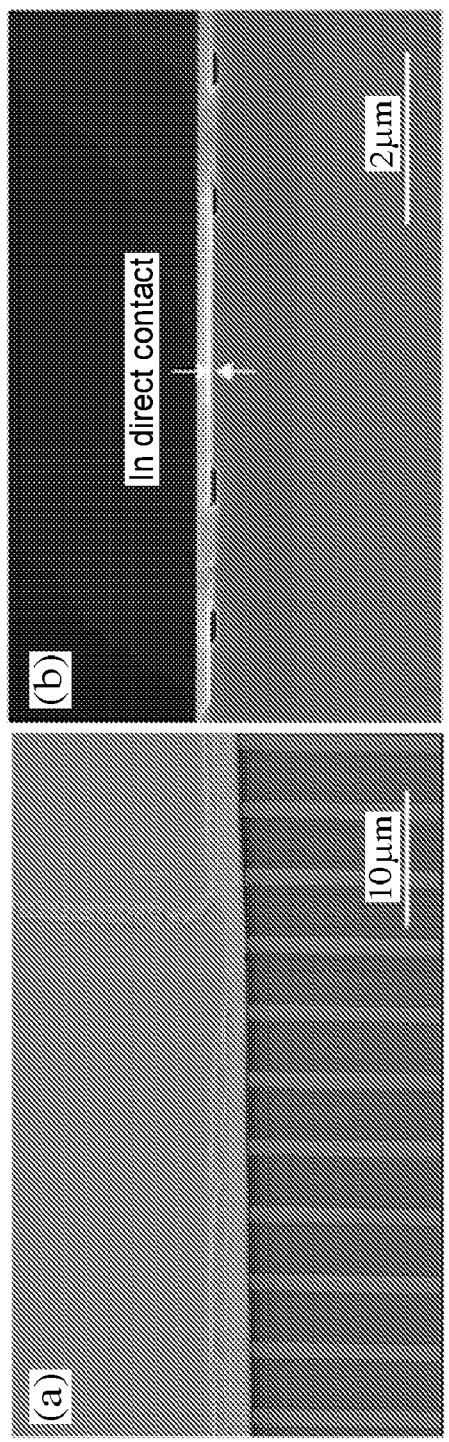
FIGS. 7A and 7B are top and cross-sectional views of a bonded sample with self-defined electrical contacts formed in another experiment to demonstrate the invention.

FIGS. 7A and 7B are top and cross-sectional views of a bonded sample with self-defined electrical contacts formed in a third set of experiments in accordance with FIGS. 4A-4B. A dry/wet etching process was used to recess the metal (Ti/Ni) lines into the $SiO_2$ layer, bringing the InGaAs thin film in direct contact with the surface of host substrate. The bonding between InGaAs thin film and the pre-defined contact leads on the $SiO_2$/Si substrate was demonstrated. The contact leads included thicker metal layers Ti/Ni (100 nm/60 nm), and the underlying 100 nm Ti acted as both the adhesion layer and the conductive leads. It is preferably that the Ti barrier layer match the depth of the recess, but it can also be thinner than the recess and the Ni can extend into the recess. In order for the transferred InGaAs film to intimately contact the host substrate, the lines of contact leads were pre-etched with Buffer Oxide Etch (BOE) solution to form a 100 nm deep trench inside the $SiO_2$ layer. This wet etching process gave a slightly extended etch profile (undercut in the $SiO_2$) near the deposited metal lines, which could be further modified by employing a dry etching process, like Reactive Ion Etch (RIE).

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention.

Various features of the invention are set forth in the appended claims.

The invention claimed is:

1. A method for integrating III-V semiconductor materials onto a rigid host substrate comprising:
   depositing a separation layer of a metal film on the rigid host substrate, wherein the separation layer is unreactive with III-V semiconductor material;
   depositing a thin layer of reactive metal on the separation layer;
   bringing functional III-V semiconductor material into contact with the thin layer of reactive metal, wherein the separation layer provides a gap between the functional III-V semiconductor material and the host substrate such that the functional III-V semiconductor material is spaced from the host substrate; and
   bonding by a low temperature heat treatment under a compressive pressure, wherein the thin layer of reactive metal and the functional semiconductor material are selected to undergo solid-state reaction and form a stable alloy under the low temperature heat treatment.

2. The method of claim 1, wherein the thin layer of reactive metal comprises a patterned metal film.

3. The method of claim 2, wherein the patterned metal film is recessed into a dielectric layer that is on top of the rigid host substrate.

4. The method of claim 2, further comprising a separation metal layer that is unreactive with the III-V semiconductor material under the low temperature heat treatment and separates the reactive metal from the rigid substrate.

5. The method of claim 4, wherein the III-V semiconductor material comprises an Arsenide or Phosphide III-V material and the reactive metal comprises Ni or Pd.

6. The method of claim 5, wherein the separation metal layer comprises Cr, Ti, or W.

7. The method of claim 2, further comprising a separation dielectric layer that is unreactive with the III-V semiconductor material under the low temperature heat treatment and separates the reactive metal from the rigid substrate.

8. The method of claim 7, wherein the III-V semiconductor material comprises an Arsenide or Phosphide III-V material and the reactive metal comprises Ni or Pd.

9. The method of claim 8, wherein the separation dielectric layer comprises $Al_2O_3$, $SiO_2$, or $Si_3N_4$.

10. The method of claim 1, wherein the III-V semiconductor material comprises an Arsenide or Phosphide III-V material and the reactive metal comprises Ni or Pd.

11. The method of claim 10, wherein the separation layer comprises Cr, Ti, or W.

12. The method of claim 2, further comprising a separation dielectric layer that is unreactive with the III-V semiconductor material under the low temperature heat treatment and separates the reactive metal from the rigid substrate.

13. The method of claim 12, wherein the III-V semiconductor material comprises an Arsenide or Phosphide III-V material and the reactive metal comprises Ni or Pd.

14. The method of claim 8, wherein the separation dielectric layer comprises $Al_2O_3$, $SiO_2$, or $Si_3N_4$.

15. The method of claim 1, wherein the III-V semiconductor material comprises an Arsenide or Phosphide III-V material and the reactive metal comprises Ni or Pd.

16. The method of claim 1, wherein the thin layer of reactive metal comprises Ni or Pd and the III-V semiconductor material comprises an arsenide or phosphide III-V material.

17. The method of claim 1, wherein the rigid host substrate comprises silicon, glass, or sapphire.

18. The method of claim 1, wherein the low temperature is in the range of 220-300° C.

19. The method of claim 18, wherein the heat treatment comprises treatment in a thermal furnace or a vacuum chamber flowing with forming gas.

20. The method of claim 19, wherein the forming gas comprises $N_2$ or Ar.

21. The method of claim 1, wherein the low temperature is high enough for the solid state reaction and low enough to avoid degradation of the functional semiconductor and the rigid substrate.

22. The method of claim 1, further comprising a step of thinning the functional III-V semiconductor material to a predetermined thickness after said bonding.

23. The method of claim 22, wherein the thinning comprises lapping, polishing, smart ion cut, or selective dry or wet etching.

24. The method of claim 1, wherein the reactive metal is metal layer having a thickness that is equal to or less than half of the thickness of the III-V semiconductor material during the solid-state reaction.

25. The method of claim 1, wherein the III-V semiconductor material comprises bulk III-V material.

26. The method of claim 25, further comprising a thin film III-V epitaxial material on the bulk III-V material.

* * * * *